United States Patent
Nakata

(10) Patent No.: US 7,894,312 B2
(45) Date of Patent: Feb. 22, 2011

(54) AUTOMATIC GAIN CONTROL CIRCUIT AND SIGNAL REPRODUCING DEVICE

(75) Inventor: Yasuo Nakata, Osaka (JP)

(73) Assignee: Panasonic Corporation, Osaka (JP)

( * ) Notice: Subject to any disclaimer, the term of this patent is extended or adjusted under 35 U.S.C. 154(b) by 1013 days.

(21) Appl. No.: 11/662,927

(22) PCT Filed: Apr. 25, 2006

(86) PCT No.: PCT/JP2006/308624

§ 371 (c)(1),
(2), (4) Date: Mar. 15, 2007

(87) PCT Pub. No.: WO2006/115254

PCT Pub. Date: Nov. 2, 2006

(65) Prior Publication Data

US 2007/0263882 A1    Nov. 15, 2007

(30) Foreign Application Priority Data

Apr. 25, 2005    (JP) .............................. 2005-126925

(51) Int. Cl.
G11B 7/00    (2006.01)
(52) U.S. Cl. ................................. 369/44.29; 369/44.36
(58) Field of Classification Search ............... 369/44.36
See application file for complete search history.

(56) References Cited

U.S. PATENT DOCUMENTS 6,606,284 B1 *   8/2003   Sakamoto et al. ........ 369/44.29
2002/0172118 A1  11/2002  Yamada et al.
2005/0135513 A1 *  6/2005  Kang et al. .................. 375/345
2006/0007804 A1 *  1/2006  Hayakawa ............... 369/44.29

FOREIGN PATENT DOCUMENTS

| JP | 63-269067 | 11/1988 |
|----|-----------|---------|
| JP | 2-270413 | 11/1990 |
| JP | 3-258118 | 11/1991 |
| JP | 4-63005 | 2/1992 |
| JP | 04-328906 | 11/1992 |
| JP | 05-199137 | 8/1993 |
| JP | 06-069816 | 3/1994 |
| JP | 10-336142 | 12/1998 |
| JP | 2000-134049 | 5/2000 |
| JP | 2002-341888 | 11/2002 |
| JP | 2004-364124 | 12/2004 |

OTHER PUBLICATIONS

Japanese Notice of Reasons for Rejection, w/ English translation thereof, issued in Japanese Patent Application No. JP 2007-514736 dated Jan. 5, 2010.

* cited by examiner

*Primary Examiner*—Lixi Chow
(74) *Attorney, Agent, or Firm*—McDermott Will & Emery LLP

(57) ABSTRACT

In a signal reproducing device, for securing the stability in the steady state while enhancing the response of automatic gain control, a variable gain amplifier 109 adjusts the amplitude of a reproduction signal outputted from a head amplifier 108. A gain control section 112 increases/decreases the gain in the variable gain amplifier 109 by a predetermined change amount according to the large-small relationship of the comparison result outputted from a comparator 111. The gain change amount control circuit 113 controls the change amount of the gain in the gain control section 112 according to the frequency of inversion of the large-small relationship of the comparison result outputted from the comparator 111.

12 Claims, 11 Drawing Sheets

AUTOMATIC GAIN CONTROL CIRCUIT AND SIGNAL REPRODUCING DEVICE

RELATED APPLICATIONS

This application is the U.S. National Phase under 35 U.S.C. §371 of International Application No. PCT/JP2006/308624, filed on Apr. 25, 2006, which in turn claims the benefit of Japanese Application No. 2005-126925, filed on Apr. 25, 2005, the disclosures of which Applications are incorporated by reference herein.

TECHNICAL FIELD

The present invention relates to a signal reproducing device, applied to disc systems such as optical disc apparatuses, for example, which amplifies a reproduction signal reproduced from a recording medium with a variable gain amplifier to reproduce a signal of a predetermined amplitude, and an automatic gain control circuit used for such a signal reproducing device and the like.

BACKGROUND ART

A disc system such as an optical disc apparatus, for example, reproduces information recorded on an optical disc by irradiating the optical disc with laser light and detecting the intensity of its reflected light. In present optical disc apparatuses, in particular DVD (digital versatile disc) players and the like, it is required for one apparatus to support reproduction from as many types of discs as possible among a variety of discs such as DVD (single-layered), DVD (double-layered), DVD-RAM, DVD-R, DVD+R, DVD-RW, DVD+RW, CD, CD-R and CD-RW. For this reason, at the time of startup of an optical disc system or change of a disc, it is necessary to identify which type of disc is mounted, optimize the system setting according to the identification result and start reproduction promptly.

DVDs and CDs have been standardized, and thus disc carriers should desirably be fabricated to conform to the standards. However, with a great number of media being available in the market, the reality is that discs nonconforming to the standards have been increasingly put in the market due to variations in fabrication process and the like. It is also noted that measures against defects such as flaws and fingerprints have increasingly become important.

To accommodate such variations in discs and variations in properties of pickups and the like, a signal reproducing device provided with an automatic gain control (AGC) function for a reproduction signal has been adopted (see Patent Literature 1, for example).

FIG. 10 is a block diagram of a conventional signal reproducing device of this type, in which an optical disc 901 (recording medium) has an information signal recorded along a helical or concentric track thereon, a rotation drive section 902 rotates the optical disc 901, a pickup 903 is an optical pickup that converges a light beam on an information recording surface of the optical disc 901 to form a light spot and detects the intensity of its reflected light to thereby output various types of information signals (reproduction signals), a focus actuator 904 moves the pickup 903 in a direction vertical to the disc plane of the optical disc 901, a tracking actuator 905 moves the pickup 903 in a radial direction of the optical disc 901, a focus control section 906 controls the focus actuator 904 according to the output of the pickup 903, a tracking control section 907 controls the tracking actuator 905 according to the output of the pickup 903, a head amplifier 908 amplifies the reproduction signal outputted from the pickup 903, a variable gain amplifier 909 adjusts the amplitude of the reproduction signal outputted from the head amplifier 908, an amplitude detection section 910 detects the amplitude of the reproduction signal outputted from the variable gain amplifier 909, a comparator 911 compares the amplitude detected by the amplitude detection section 910 with a predetermined amplitude, and a gain control section 912 control the gain in the variable gain amplifier 909 according to the output of the comparator 911.

In the conventional signal reproducing device configured as described above, in disc reproduction, the focus control section 906 and the tracking control section 907 perform processing for stabilizing focus servo and tracking servo based on the output of the pickup 903, and the focus actuator 904 and the tracking actuator 905 are driven to execute focus servo and tracking servo. In this way, the pickup 903 is allowed to follow the track while maintaining the focused state.

The AGC using the variable gain amplifier will be described with reference to FIG. 11. FIG. 11 schematically shows waveforms in disc reproduction, in which FIG. 11(a) is a schematic view of a reproduction signal from the pickup 903 amplified by the head amplifier 908, and FIG. 11(b) is a schematic view of an output signal of the variable gain amplifier 909. The output of the variable gain amplifier 909 is inputted into the amplitude detection section 910, which then generates an amplitude signal. As described in the Patent Literature 1, the amplitude of a reproduction signal is normally detected by calculating the difference between the upper envelope and the lower envelope of the reproduction signal. The detected amplitude is then compared with a predetermined amplitude level by the comparator 911. Based on the output of the comparator 911, the gain in the variable gain amplifier 909 is determined by the gain control section 912. The gain in the variable gain amplifier 909 is thus controlled so that the output of the variable gain amplifier 909 has the predetermined amplitude. Meanwhile, measures have been taken for a reproduction signal from the actual disc surface to respond to various circumstances including the focus control state, the tracking control state and the state of the disc surface.

When reproduction is made from a flawed disc or a dirty disc such as a so-called fingerprinted disc, the amplitude of a reproduction signal frequently increases/decreases as shown in FIG. 11(a). With response of AGC, however, control is made to give a predetermined amplitude as shown in FIG. 11(b). More specifically, with response of AGC, even when the amplitude of the reproduction signal has greatly decreased as in the time period t1 to t2, the degree of the decrease is minimized. Also, when the amplitude gradually changes as in the time period t3 to t4, control is made to maintain the predetermined amplitude.

Patent Literature 1: Japanese Laid-Open Patent Publication No. 2000-134049

DISCLOSURE OF THE INVENTION

Problems to be Solved by the Invention

However, in the conventional signal reproducing device described above, if the response is set low, it will be difficult to keep the amplitude constant by following the change of the amplitude. On the contrary, if the response is set high, the amplitude can be made constant at all times. In this case, however, increase/decrease of the gain is frequently repeated, and this may possibly adversely affect jitter of the reproduction signal (cause jitter to occur and increase). Moreover, excessive response to noise and the like may cause a problem (excessive response may adversely affect the improvement of S/N (jitter reduction in binary processing) that is an original object of AGC). It is therefore difficult to widely enhance the response. For these reasons, as a prior art problem, it is difficult to secure the stability in various signal reproduction states while enhancing the sensitivity of the automatic gain control function.

To solve the prior art problem described above, an object of the present invention is providing a signal reproducing device in which it is easily possible to secure the stability in the steady state while enhancing the response of automatic gain control.

Means for Solving the Problems

To solve the above problem, the present invention is directed to an automatic gain control circuit for amplifying an input signal, including:

a variable gain amplifier for amplifying an input signal with a variable gain;

an amplitude detection circuit for detecting the amplitude of the input signal;

a gain control section for controlling the gain according to the amplitude of the input signal; and a gain change amount control circuit for controlling a change amount of the gain controlled, according to the frequency of increase/decrease of the gain caused by the control.

The gain change amount control circuit may perform at least either control of reducing the gain change amount when the frequency of increase/decrease of the gain is larger than a predetermined value or control of increasing the gain change amount when the frequency of increase/decrease of the gain is smaller than a predetermined value.

The gain change amount control circuit may perform either control of reducing the gain change amount within a predetermined lower limit when the frequency of increase/decrease of the gain is larger than a predetermined value or control of increasing the gain change amount within a predetermined upper limit when the frequency of increase/decrease of the gain is smaller than a predetermined value.

The gain change amount control circuit may determine the frequency of increase/decrease of the gain based on the amplitude of the input signal.

In place of the gain change amount control circuit described above, a dead zone control circuit for controlling the width of an amplitude detection dead zone in the amplitude detection circuit according to the frequency of increase/decrease of the gain caused by the control may be provided.

Furthermore, a signal reproducing device for amplifying a reproduction signal reproduced from a recording medium may be configured using the automatic gain control circuit described above.

In the case described above, an error detection circuit for detecting at least one error among a focus error, a tracking error and a defect of the reproduction signal may be provided, and the gain change amount control circuit may reduce the change amount of the gain when the frequency of increase/decrease of the gain is larger than a predetermined value, and if any of the errors is detected, turn the gain change amount back to a predetermined initial value.

Accordingly, the gain control circuit controls the gain in the variable gain amplifier according to the amplitude of an input signal detected by the detection circuit so that the amplitude is constant. The gain change amount control circuit controls the change amount of the gain caused by the gain control according to the frequency of increase/decrease of the gain obtained by the gain control or the amplitude of the input signal. Alternatively, the dead zone control circuit controls the width of the amplitude detection dead zone in the amplitude detection circuit. In amplification of the reproduction signal reproduced from a recording medium, if a focus error or the like is detected by the error detection circuit, the gain change amount or the width of the dead zone is turned back to a predetermined initial value.

Effect of the Invention

According to the present invention, in a signal reproducing device, it is easy to secure the stability in the steady state while enhancing the response of automatic gain control.

DESCRIPTION OF REFERENCE NUMERALS

Figure 1:
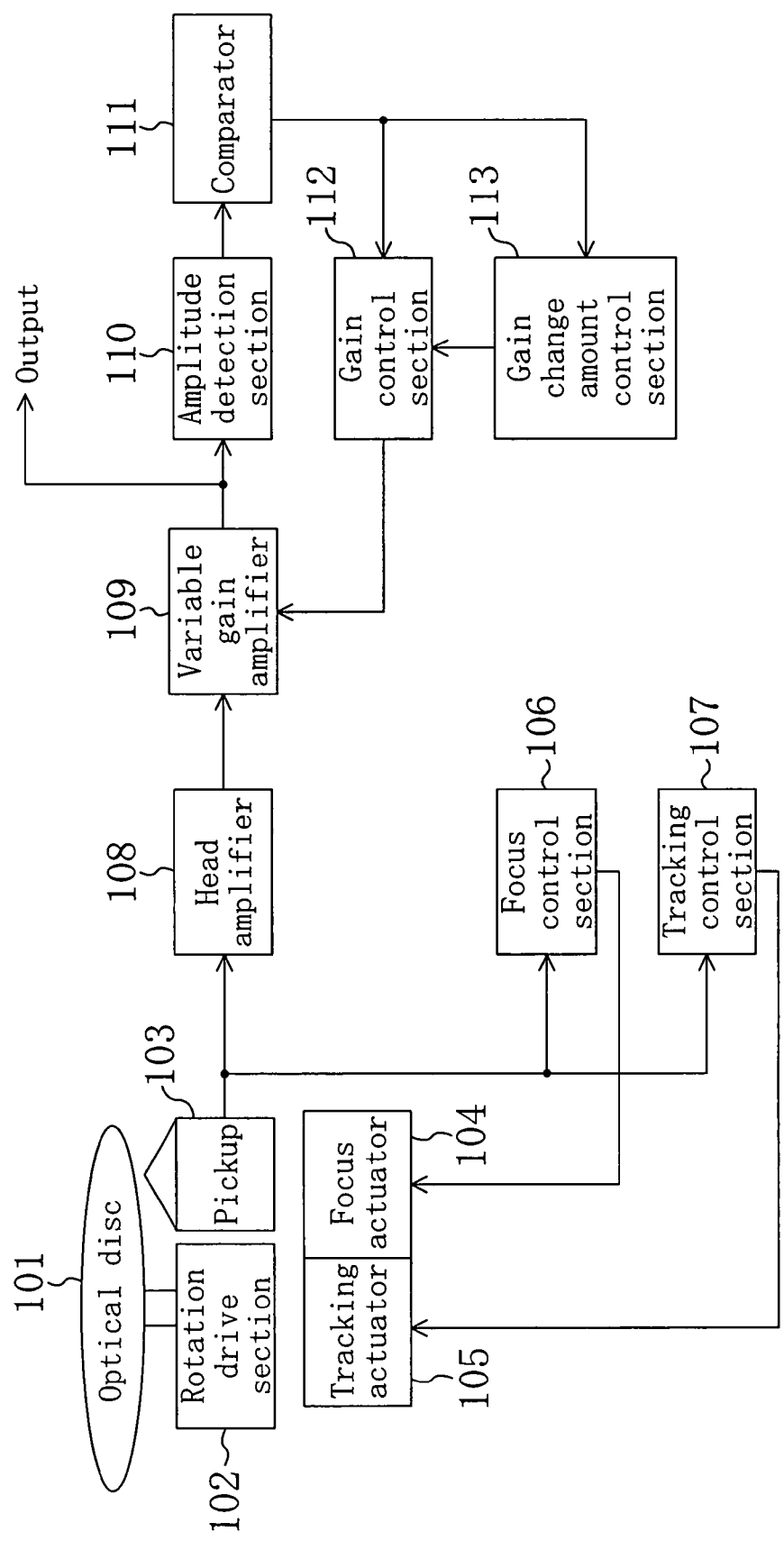
FIG. 1 is a block diagram of a major portion of an optical disc apparatus of Embodiment 1.

101 Optical disc
102 Rotation drive section
103 Pickup
104 Focus actuator
105 Tracking actuator
106 Focus control section
107 Tracking control section
108 Head amplifier
109 Variable gain amplifier
110 Amplitude detection section
111 Comparator
112 Gain control section
113 Gain change amount control section
206 Focus control section
207 Tracking control section
213 Gain change amount control section
214 Defect detection section
311 First comparator
312 Gain control section
313 Gain change amount control section
315 Second comparator

BEST MODE FOR CARRYING OUT THE INVENTION

Hereinafter, embodiments of the present invention will be described with reference to the accompanying drawings. Note that in the embodiments to follow, components having like features are denoted by the same reference numerals, and the description thereof is not repeated.

Embodiment 1

As Embodiment 1 of the present invention, described will be an example of an optical disc apparatus that determines whether or not increase/decrease of the gain has been repeated, and based on the determination result, decreases or increases the change amount of the amplification rate, so that the stability in the steady state can be secured while the response is enhanced.

FIG. 1 is a block diagram of a major portion of an optical disc apparatus. In this figure, an optical disc 101 is a recording medium having a helical or concentric track thereon along which an information signal is recorded.

A rotation drive section 102 rotates the optical disc 101.

A pickup 103 converges a light beam on an information recording surface of the optical disc 101 to form a light spot, and detects the intensity of its reflected light, to thereby output various types of information signals (reproduction signals).

A focus actuator 104 moves the pickup 103 (an objective lens and the like not shown in the pickup) in a direction vertical to the disc plane of the optical disc 101.

A tracking actuator 105 moves the pickup 103 (an objective lens and the like not shown in the pickup) in a radial direction of the optical disc 101.

A focus control section 106 controls the focus actuator 104 according to the output of the pickup 103.

A tracking control section 107 controls the tracking actuator 105 according to the output of the pickup 103.

A head amplifier 108 amplifies the reproduction signal outputted from the pickup 103.

A variable gain amplifier 109 adjusts the amplitude of the reproduction signal outputted from the head amplifier 108.

An amplitude detection section 110 detects the amplitude of the reproduction signal outputted from the variable gain amplifier 109.

A comparator 111 compares the amplitude detected by the amplitude detection section 110 with a predetermined amplitude (reference level).

A gain control section 112 increases/decreases the gain in the variable gain amplifier 109 by a predetermined change amount according to the large-small relationship of the comparison result outputted from the comparator 111.

A gain change amount control section 113 controls the gain change amount determined by the gain control section 112, according to the frequency of inversion of the large-small relationship of the comparison result outputted from the comparator 111 (thus, the frequency of increase/decrease of the gain in the variable gain amplifier 109). More specifically, the number of times of inversion of the large-small relationship of the comparison result (continuously occurring changes, incidence) is counted every predetermined time period. If the inversion is repeated a predetermined number of times within the predetermined time period, the gain change amount in the gain control section 112 is changed to a smaller value. If the number of times of inversion within the predetermined time period is smaller than the predetermined number of times, the gain change amount is changed to a larger value. Alternatively, the time taken may be measured every time the count reaches the predetermined number of times, to perform similar control.

The portion of the apparatus other than the mechanical parts including the rotation drive section 102, the pickup 103, the focus actuator 104 and the tracking actuator 105 may be configured as hardware integrated on one semiconductor device, for example, or may be implemented by software.

Next, the operation of the optical disc apparatus configured as described above will be described.

First, servo control of the pickup 103 will be described briefly. In reproduction of a signal recorded on the optical disc 101, the focus control section 106 and the tracking control section 107 perform processing for stabilizing focus servo and tracking servo based on the output obtained from the pickup 103, and the focus actuator 104 and the tracking actuator 105 are driven to execute focus servo control and tracking servo control. In this way, the pickup 103 is allowed to follow the track while maintaining the focused state.

Control of the gain in the variable gain amplifier 109 will then be described.

The signal from the head amplifier 108 is inputted into the variable gain amplifier 109 and amplified. The amplitude of the amplified signal is detected by the amplitude detection section 110. The detected amplitude is compared with a predetermined reference level by the comparator 111, and the resultant large-small comparison result is inputted into the gain control section 112 and the gain change amount control section 113.

The gain control section 112 controls the variable gain amplifier 109 to allow gain-up or gain-down by a predetermined gain change amount based on the large-small comparison result. More specifically, control is made so that if the amplitude detected by the amplitude detection section 110 is smaller than the predetermined reference level, the gain in the variable gain amplifier 109 is increased by a predetermined gain change amount given from the gain change amount control section 113 every predetermined timing, and if it is larger than the predetermined reference level, the gain is decreased by the predetermined gain change amount every predetermined timing.

Figure 2:
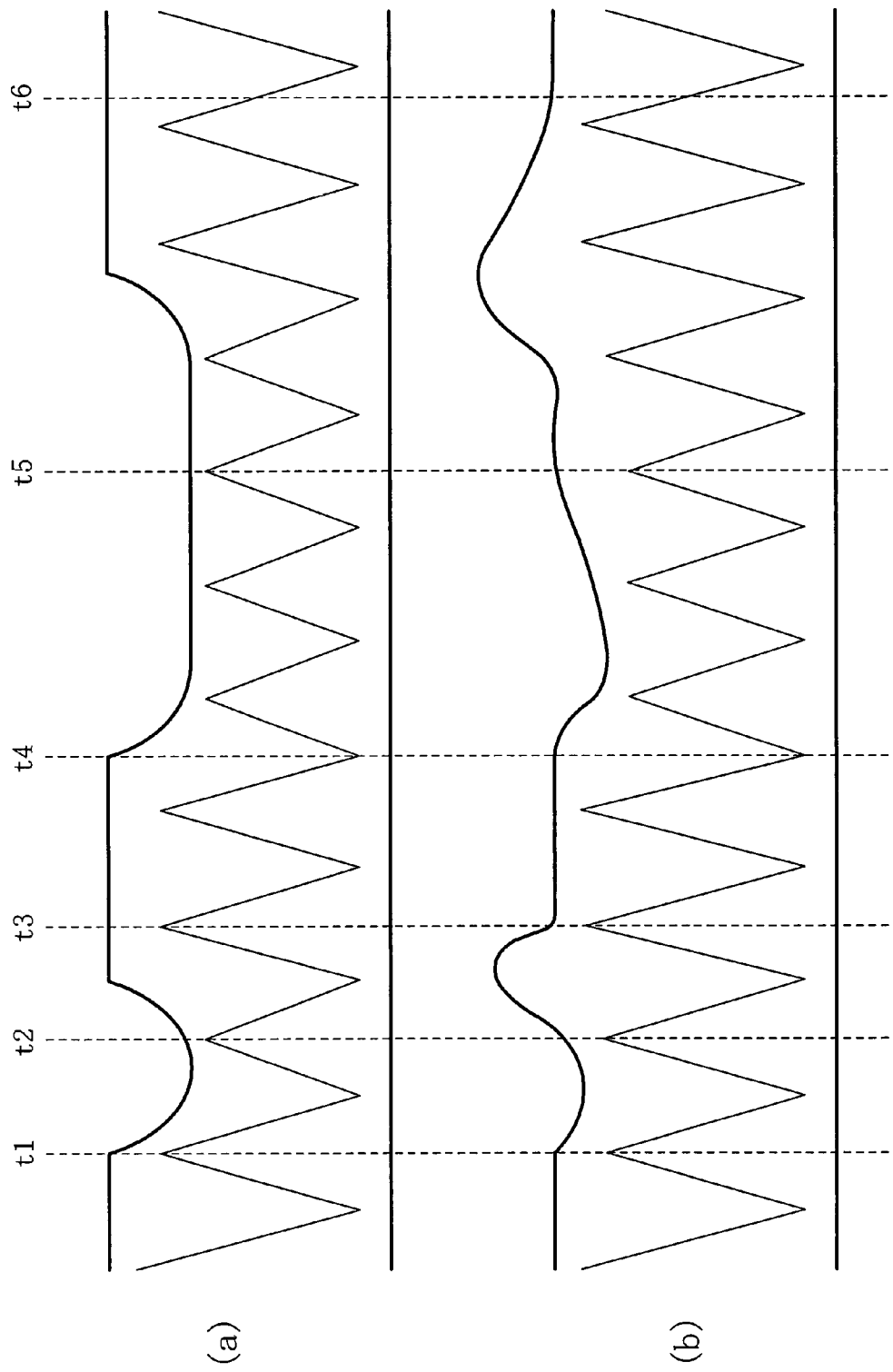
FIG. 2 is a graph showing an example of input/output signals of a variable gain amplifier 109 in Embodiment 1.

FIG. 2 is a graph showing an example of an input signal (FIG. 2(a)) and an output signal (FIG. 2(b)) of the variable gain amplifier 109 in which the gain is turned up and down when an amplitude variation occurs due to a comparatively small flaw and the like on the optical disc 101 and due to noise and the like, for example. In FIG. 2, the x-axis represents the time and the y-axis represents the voltage.

Assume that at and before time t1, the input/output signals of the variable gain amplifier 109 had the steady-state output amplitude (reference level) and after the time t1, the amplitude of the signal inputted into the variable gain amplifier 109 decreases. In this situation, the comparator 111 outputs a signal indicating that the output amplitude of the variable gain amplifier 109 is smaller than the reference level to the gain control section 112 and the gain change amount control section 113. The gain control section 112 then outputs a control signal for increasing the gain in the variable gain amplifier 109 by a predetermined change amount given from the gain change amount control section 113 to the variable gain amplifier 109. Thus, the decrease in the output amplitude of the variable gain amplifier 109 is minimized as shown in FIG. 2(b).

At time t2, the output amplitude of the variable gain amplifier 109 becomes identical to the reference level. After that, if the input amplitude continues increasing, the comparator 111 outputs a signal indicating that the output amplitude of the variable gain amplifier 109 is larger than the reference level to the gain control section 112 and the gain change amount control section 113. The gain control section 112 then outputs a control signal for decreasing the gain in the variable gain amplifier 109 by a predetermined change amount given from the gain change amount control section 113 to the variable gain amplifier 109, to reduce the gain in the variable gain amplifier 109. The output amplitude then resumes the reference level at time t3.

As described above, when the amplitude of the input signal decreases due to a small flaw and the like on the optical disc 101, the gain in the variable gain amplifier 109 repeats gain-up and gain-down. Likewise, for a comparatively large flaw as that over the time period t4 to t6, also, gain-up and gain-down are repeated.

Figure 3:
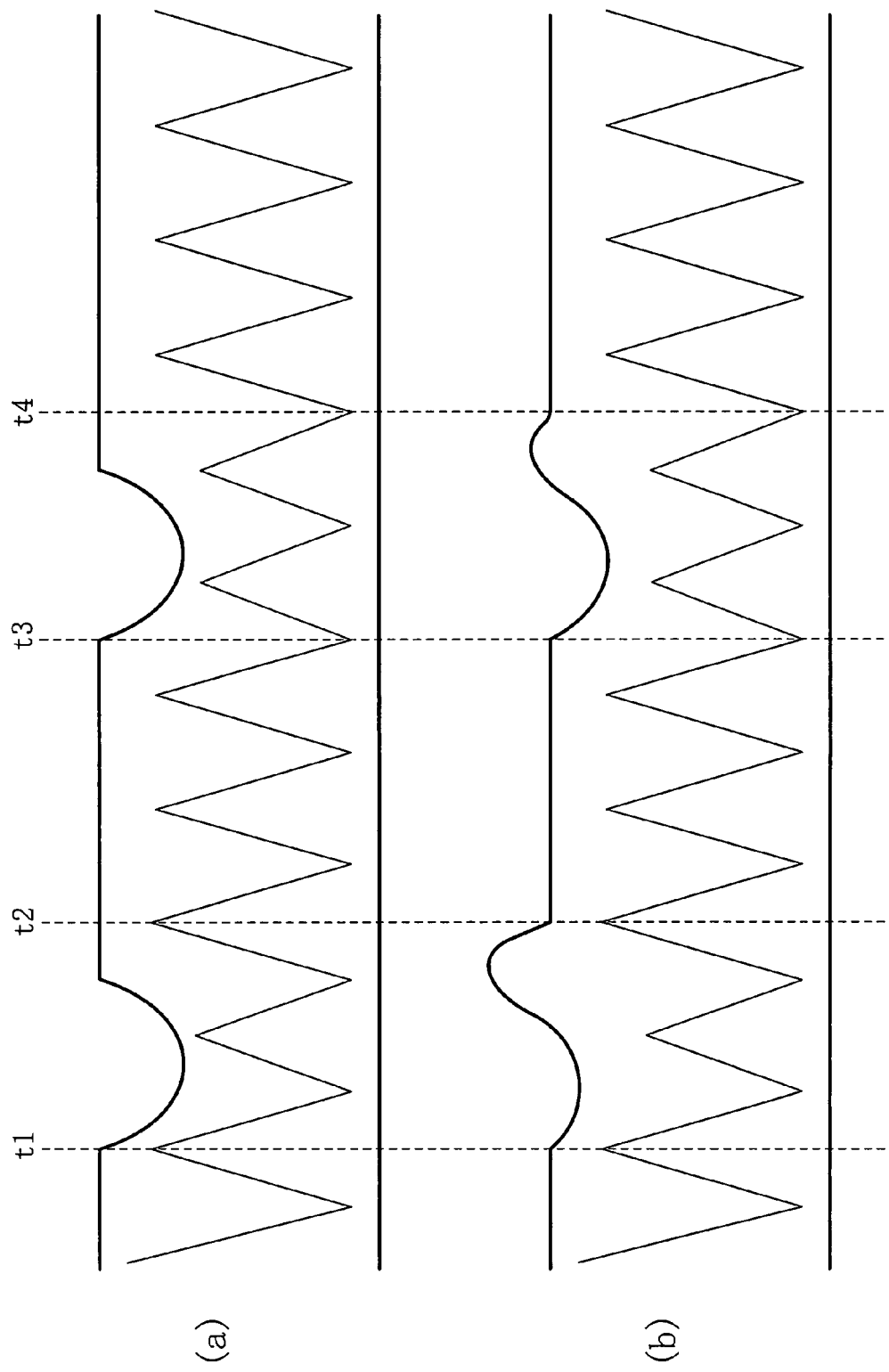
FIG. 3 is a graph showing an example of input/output signals of the variable gain amplifier 109 in Embodiment 1 observed when the gain change amount decreases.

The gain change amount control section 113 counts the number of times of inversion (from large to small, or from small to large) of the large-small comparison result from the comparator 111. If the number of times of inversion within a predetermined time period exceeds a predetermined number of times, the gain change amount control section 113 outputs a signal instructing the gain control section 112 to change the predetermined gain change amount to a smaller gain change amount. As a result, the gain control section 112 controls so that the gain in the variable gain amplifier 109 changes with a gain change amount smaller than a predetermined initial state, for example. In this way, as shown in t3 to t4 in FIG. 3, the variable gain amplifier 9 is prevented from responding excessively. In other words, by reducing the gain change amount for the variable gain amplifier based on the inversion of the signal amplitude large-small comparison result, the stability of AGC in the steady state is secured, and thus unnecessary jitter can be suppressed.

Also, if the number of times of inversion within a predetermined time period is less than a predetermined number of times, the gain change amount control section 113 outputs a signal instructing the gain control section 112 to change the predetermined gain change amount to a larger gain change amount. As a result, the gain control section 112 controls so that the gain in the variable gain amplifier 109 changes with the initial-state gain change amount, for example. In this way, such a situation that the gain change amount is so small that the response of AGC becomes excessively slow is prevented.

In the above example, the gain change amount was controlled in two stages, i.e., the initial state and a smaller gain change amount (or the initial state and a larger gain change amount). Alternatively, it may be controlled in multiple stages according to the number of times of inversion within a predetermine time period, or may be controlled in multiple stages according to continuation of the state in which the number of times of inversion is less than a predetermined number of times.

Otherwise, only decreasing or increasing the gain change amount may be executed.

In the case that the gain change amount is controlled in multiple stages and only decreasing the gain change amount is executed, there is a possibility that the gain change amount is so small that the response of AGC becomes excessively slow as described above. In this case, therefore, a lower limit of the gain change amount may be provided in the gain change amount control section 113, to achieve further stable AGC. Likewise, in the case of only increasing the gain change amount, an upper limit may be provided.

Alternatively, the gain change amount may simply be reduced at the time when the inversion has been counted a predetermined number of times.

The gain control by the gain control section 112 may be performed, not based on the result of the large-small comparison between the amplitude and a predetermined reference level by the comparator 111, but based on the difference between the amplitude and the reference level. More specifically, the gain may be controlled so as to be proportional to the product of the difference between the amplitude and the reference level and a value specified by the gain change amount control section 113, for example.

Embodiment 2

Figure 4:
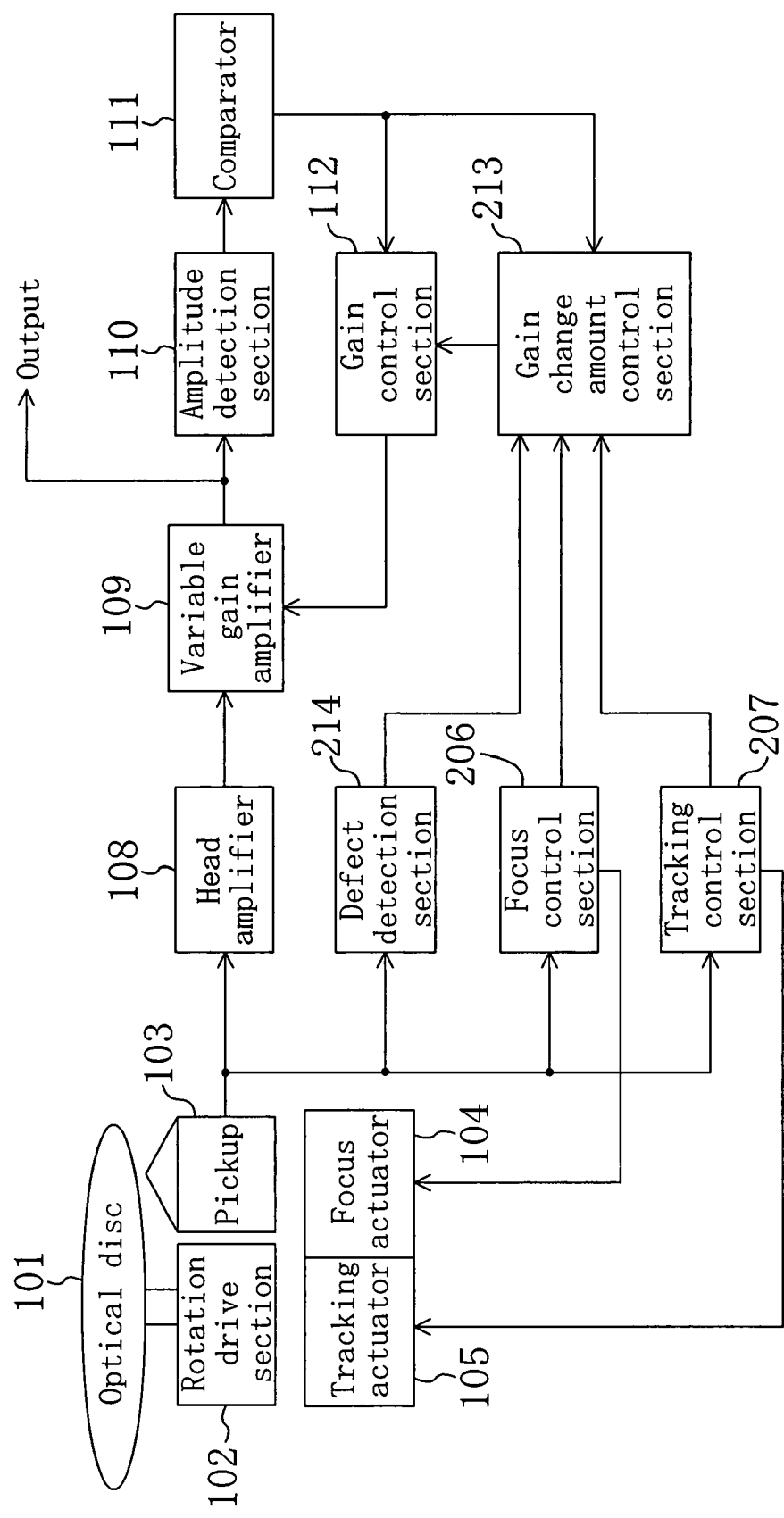
FIG. 4 is a block diagram of a major portion of an optical disc apparatus of Embodiment 2.

As shown in FIG. 4, an optical disc apparatus of Embodiment 2 is different from the optical disc apparatus of Embodiment 1 in that a focus control section 206, a tracking control section 207 and a gain change amount control section 213 are provided in place of the focus control section 106, the tracking control section 107 and the gain change amount control section 113, and a defect detection section 214 is newly provided.

The focus control section 206 and the tracking control section 207 not only control the focus actuator 104 and the tracking actuator 105, like the focus control section 106 and the tracking control section 107, but also output an out-of-focus detection signal and an out-of-tracking detection signal when a so-called out-of-focus state and out-of-tracking state occur.

The defect detection section 214 detects a defect of a reproduction signal in a manner described later based on the output of the pickup 103, and outputs a defect detection signal.

The gain change amount control section 213 not only controls the gain change amount, like the gain change amount control section 113, but also turns the gain change amount back to a predetermined initial state according to any of the out-of-focus detection signal, the out-of-tracking detection signal and the defect detection signal respectively outputted from the focus control section 206, the tracking control section 207 and the defect detection section 214.

Next, the operation of the components described above will be described.

Figure 5:
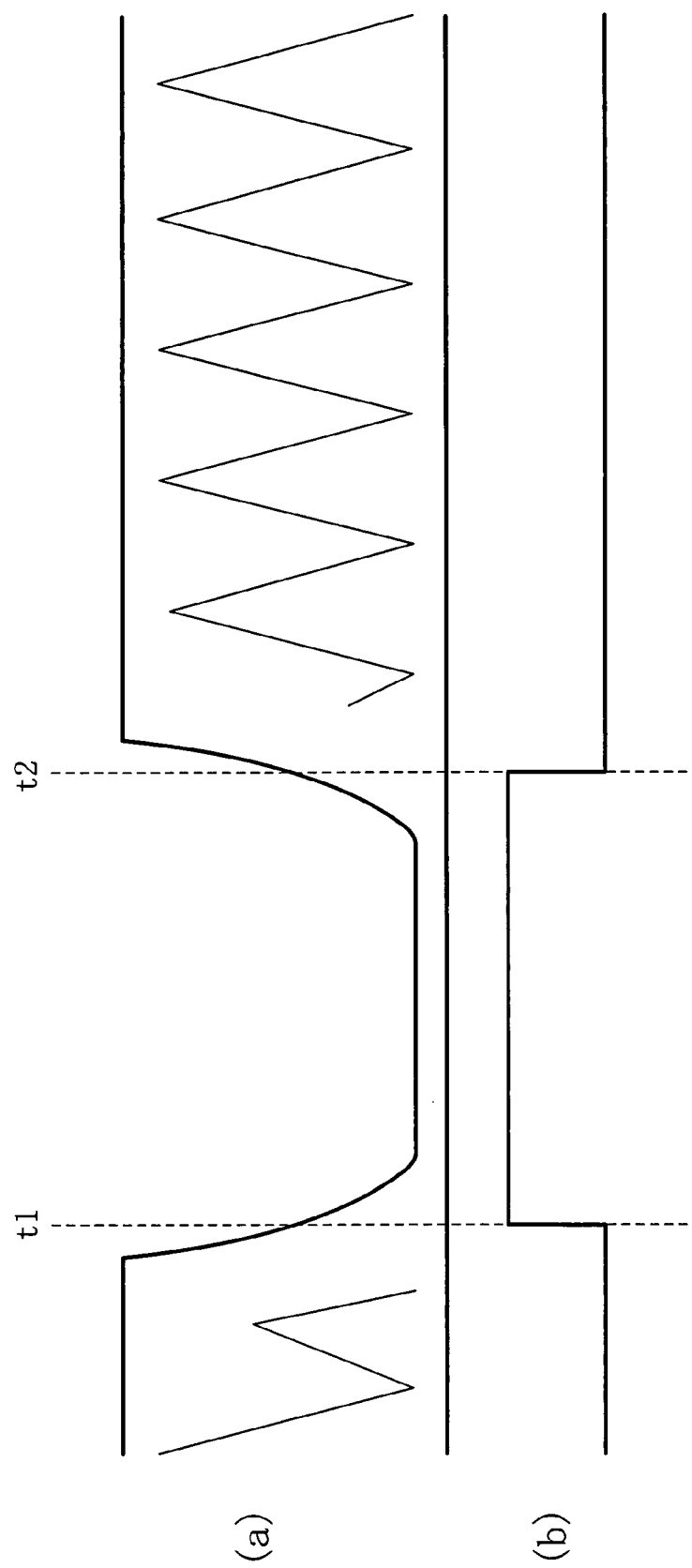
FIG. 5 is a graph showing an example of a reproduction signal from a defect portion and the like of an optical disc 101 and the like in Embodiment 2.

FIG. 5 schematically shows the waveform of a reproduction signal observed when the pickup 103 passes a defect portion of the optical disc 101 and a defect detection signal outputted from the defect detection section 214, in which FIG. 5(a) shows the output signal of the pickup 103 as the reproduction signal and FIG. 5(b) shows the corresponding defect detection signal. When reproduction is being made from the disc normally (when the pickup 103 is located above a region on the disc having no defect), a reproduction signal having flat amplitude is outputted from the pickup 103 as observed until time t1 in FIG. 5(a). When the reproduction signal is missing causing decrease in amplitude at the time t1, the defect detection section 214 detects the sharp amplitude decrease (loss of the upper envelope) and outputs a defect detection signal as shown in FIG. 5(b) (activates the detection signal). Thereafter, once the amplitude recovers as before the time t1 at time t2, no defect is any more detected.

Figure 6:
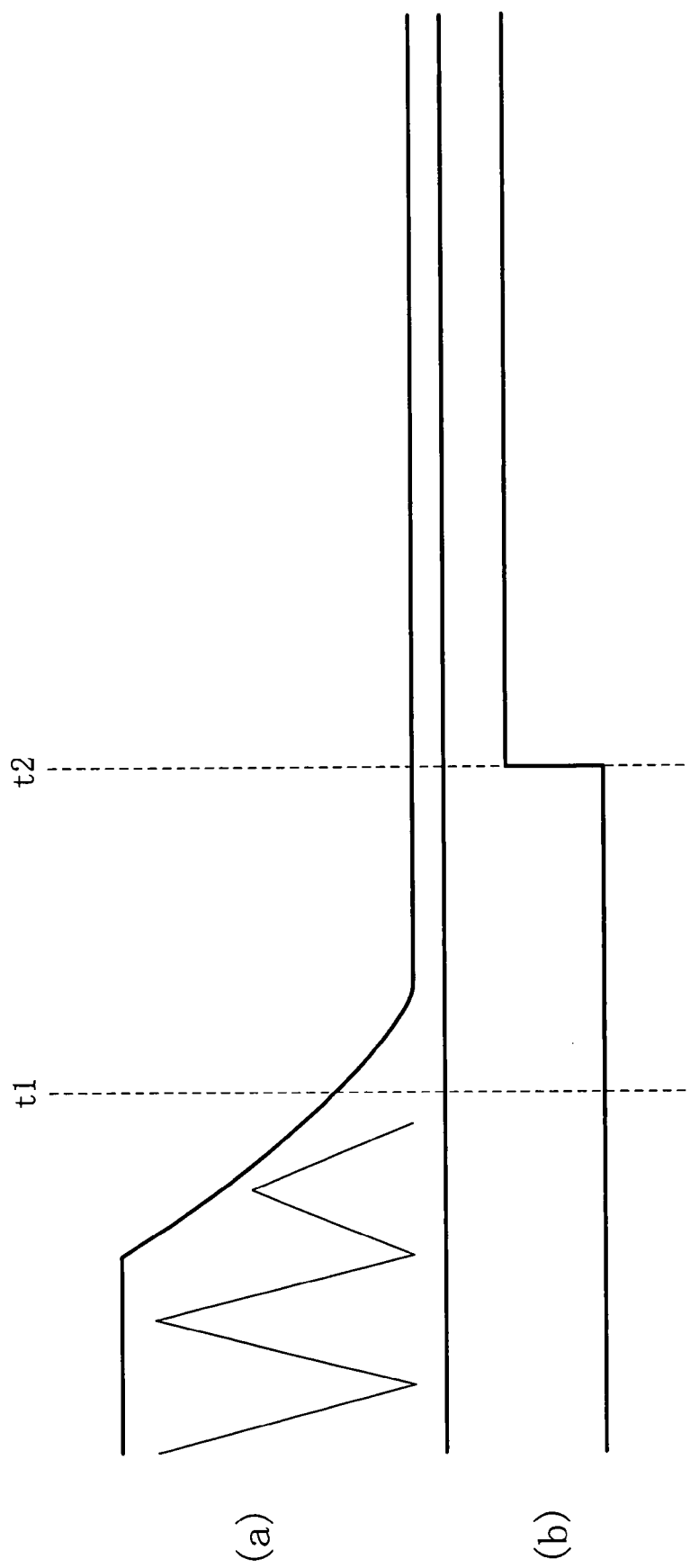
FIG. 6 is a graph showing an example of a reproduction signal observed in an out-of-focus state and the like in Embodiment 2.

FIG. 6 schematically shows the waveform of a reproduction signal in an out-of-focus state and an out-of-focus detection signal outputted from the focus control section 206, in which FIG. 6(a) shows the output signal of the pickup 103 as the reproduction signal and FIG. 6(b) shows the out-of-focus detection signal. When reproduction is being made from the disc surface normally (when the focused state is maintained), a reproduction signal having flat amplitude is outputted from the pickup 103 as observed until time t1 in FIG. 6(a). If focusing fails, the intensity of reflected light from the disc surface decreases resulting in decrease in the amplitude of the reproduction signal as shown in FIG. 6(a). If this amplitude decrease continues for a predetermined time period (t2-t1), the focus control section 206 determines this state as out-of-focus distinguished from the state observed when a defect portion is passed described above, and outputs an out-of-focus detection signal as shown in FIG. 6(b) (activates the detection signal).

Figure 7:
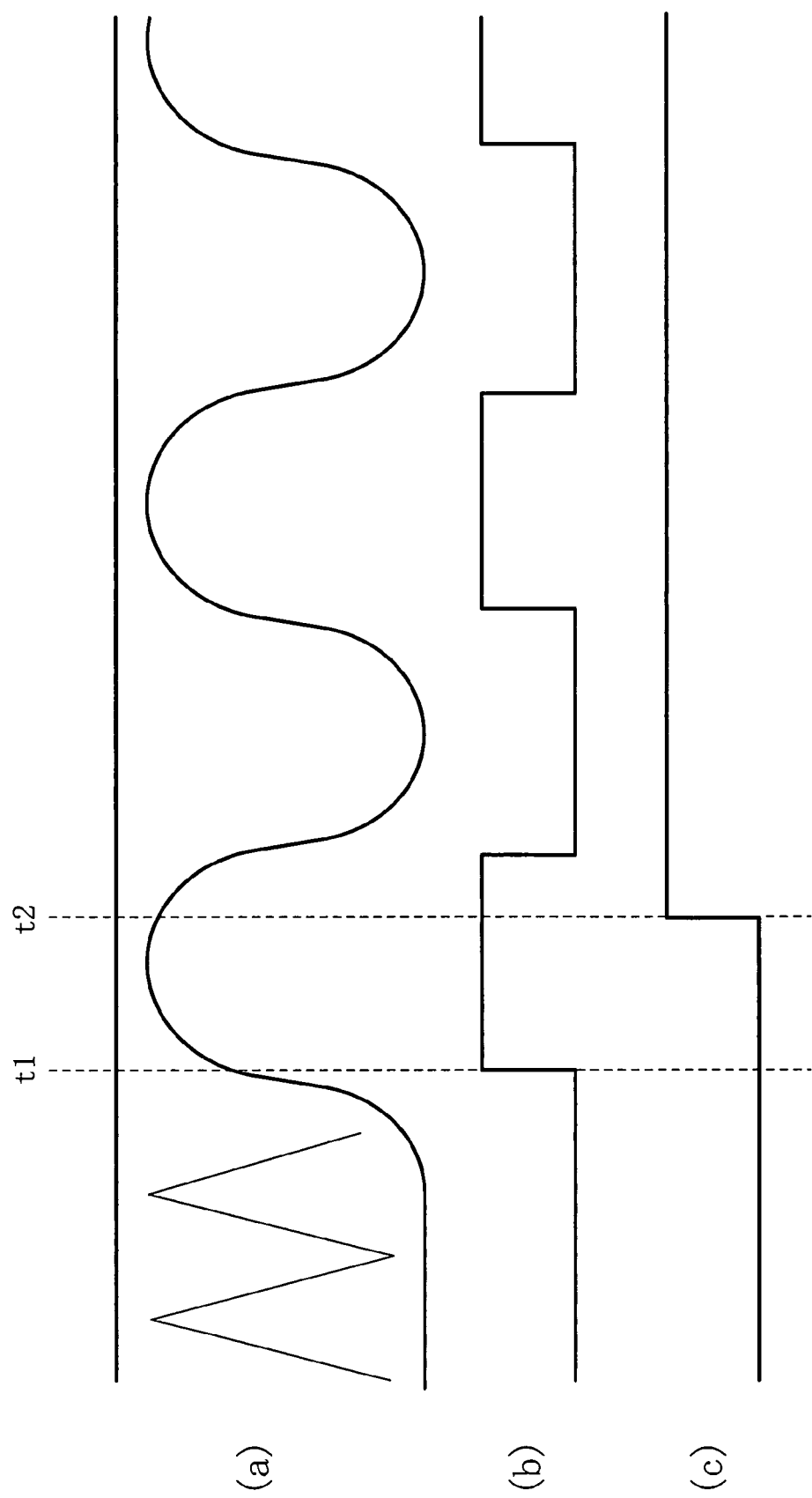
FIG. 7 is a graph showing an example of a reproduction signal observed in an out-of-tracking state and the like in Embodiment 2.

FIG. 7 schematically shows the waveform of a reproduction signal in an out-of-tracking state, an out-of-tracking detection signal outputted from the tracking control section 207 and the like, in which FIG. 7(a) shows the output signal of the pickup 103 as the reproduction signal, FIG. 7(b) shows an off-track signal, and FIG. 7(c) shows the out-of-tracking detection signal. When reproduction is being made from the disc surface normally (when the light spot follows the track on the optical disc 101), a reproduction signal having flat amplitude is outputted from the pickup 103 as observed until time t1 in FIG. 7(a). If tracking fails, resulting in the light spot scanning the track and the space between track lines over a plurality of track lines on the surface of the optical disc 101, the lowest intensity of the reflected light is intermittently close to the highest intensity thereof. Therefore, as shown in FIG. 7(a), the amplitude of the reproduction signal (amplitude of a high frequency component) increases/decreases repeatedly with the rise of the lower-limit level of the reproduction signal. With the decrease of the amplitude, an off-track signal is activated, for example, as shown in FIG. 7(b). If the active period of the off-track signal continues for a predetermined time period (t2-t1) (this condition serves to suppress an influence of mixing of noise into the off-track signal), the tracking control section 207 outputs an out-of-tracking detection signal as shown in FIG. 7(c).

The gain change amount control section 213 instructs the gain control section 112 to turn the gain change amount back to its initial state according to any of the defect detection signal, the out-of-focus detection signal and the out-of-tracking detection signal described above. With this, even if the gain change amount control section 213 has changed the gain change amount to a small value by the time t1, for example, the response speed of AGC is prevented from being low at the time of recovery from the passing through a defect portion, the out-of-focus state and the out-of-tracking state, and thus the output of the variable gain amplifier 109 is promptly adjusted to the normal amplitude. Note that in the case that the gain change amount has been changed to a large value at the time of output of the defect detection signal or the like, this change amount may be maintained.

Accordingly, as described in Embodiment 1, it is possible to secure the stability of AGC in the steady state allowing suppression of jitter while preventing the variable gain amplifier 109 from responding excessively when the large-small relationship between the output amplitude of the variable gain amplifier 109 and the reference level frequently changes. In addition to this, the response of AGC can be kept at a high level after the passing through a defect portion and at the time of re-focusing and re-tracking.

In the above example, the gain change amount control section 213 made an instruction so that the gain change amount resumes its initial state based on the defect detection signal, the out-of-focus signal and the out-of-tracking signal. Alternatively, the instruction may be made based on one or two of the detection signals.

Embodiment 3

Figure 8:
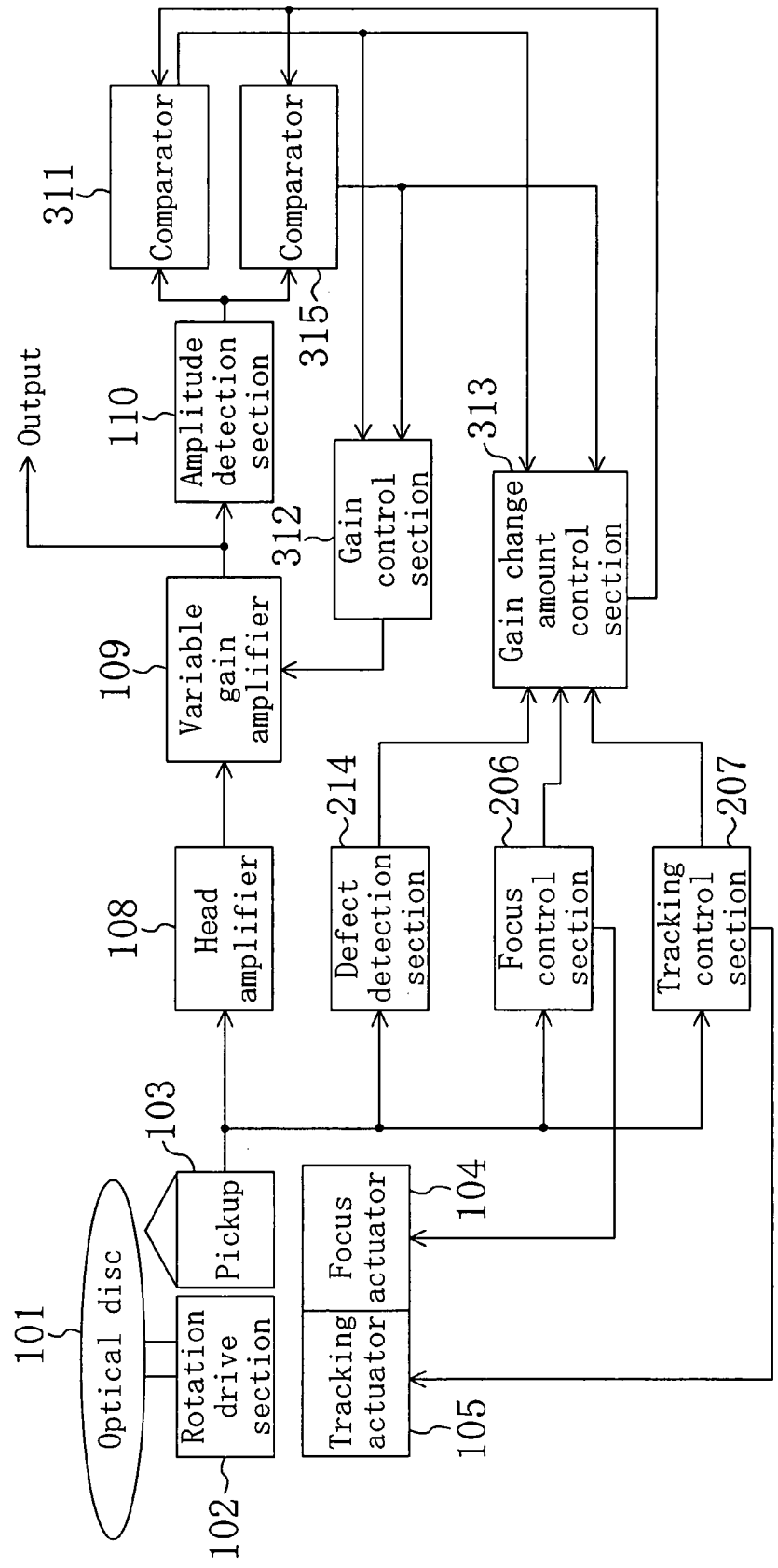
FIG. 8 is a block diagram of a major portion of an optical disc apparatus of Embodiment 3.

As shown in FIG. 8, an optical disc apparatus of Embodiment 3 is different from the optical disc apparatus of Embodiment 2 in that a first comparator 311, a second comparator 315, a gain control section 312 and a gain change amount control section 313 are provided in place of the comparator 111, the gain control section 112 and the gain change amount control section 213.

The first comparator 311 and the second comparator 315 compare the reproduction signal amplitude detected by the amplitude detection section 110 with predetermined reference levels v1 and v2 different from each other (v1<v2) set in the manner described later.

The gain control section 312 changes the gain in the variable gain amplifier 109 depending on the small-large relationship of the comparison results outputted from the comparators 311 and 315. More specifically, the gain control section 312 increases the gain in the variable gain amplifier 109 by a predetermined change amount if the reproduction signal amplitude is smaller than v1, for example, and decreases the gain in the variable gain amplifier 109 by a predetermined change amount if it is larger than v2 (the level range between v1 and v2 constitutes a dead zone of gain control).

If finding from the comparison results outputted from the comparators 311 and 315 every predetermine time period that inversion of gain increase/decrease occurs, that is, the state in which the reproduction signal amplitude is smaller than v1 and the state in which it is larger than v2 are repeated, a predetermined number of times, the gain change amount control section 313 controls the reference levels v1 and v2 of the comparators 311 and 315 to widen the dead zone. Contrarily, if the number of times of inversion within the predetermined time period is smaller than the predetermined number of times, the dead zone is narrowed. Also, the width of the dead zone is turned back to its original state according to any of the out-of-focus detection signal, the out-of-tracking detection signal and the defect detection signal outputted from the focus control section 206, the tracking control section 207 and the defect detection section 214.

Next, the operation of the components described above will be described.

Figure 9:
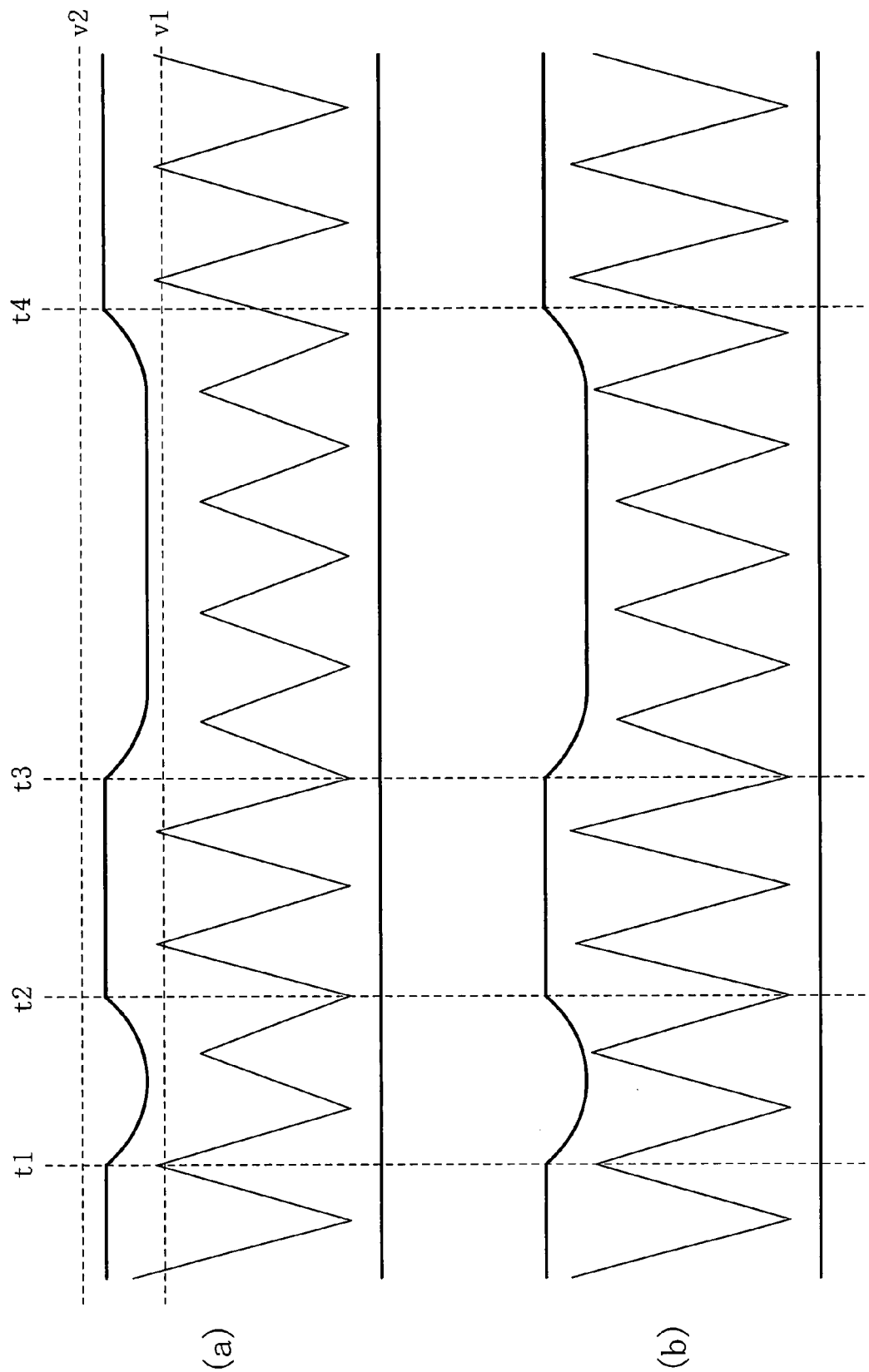
FIG. 9 is a graph showing an example of input/output signals of a variable gain amplifier 109 in Embodiment 3.
Figure 10:
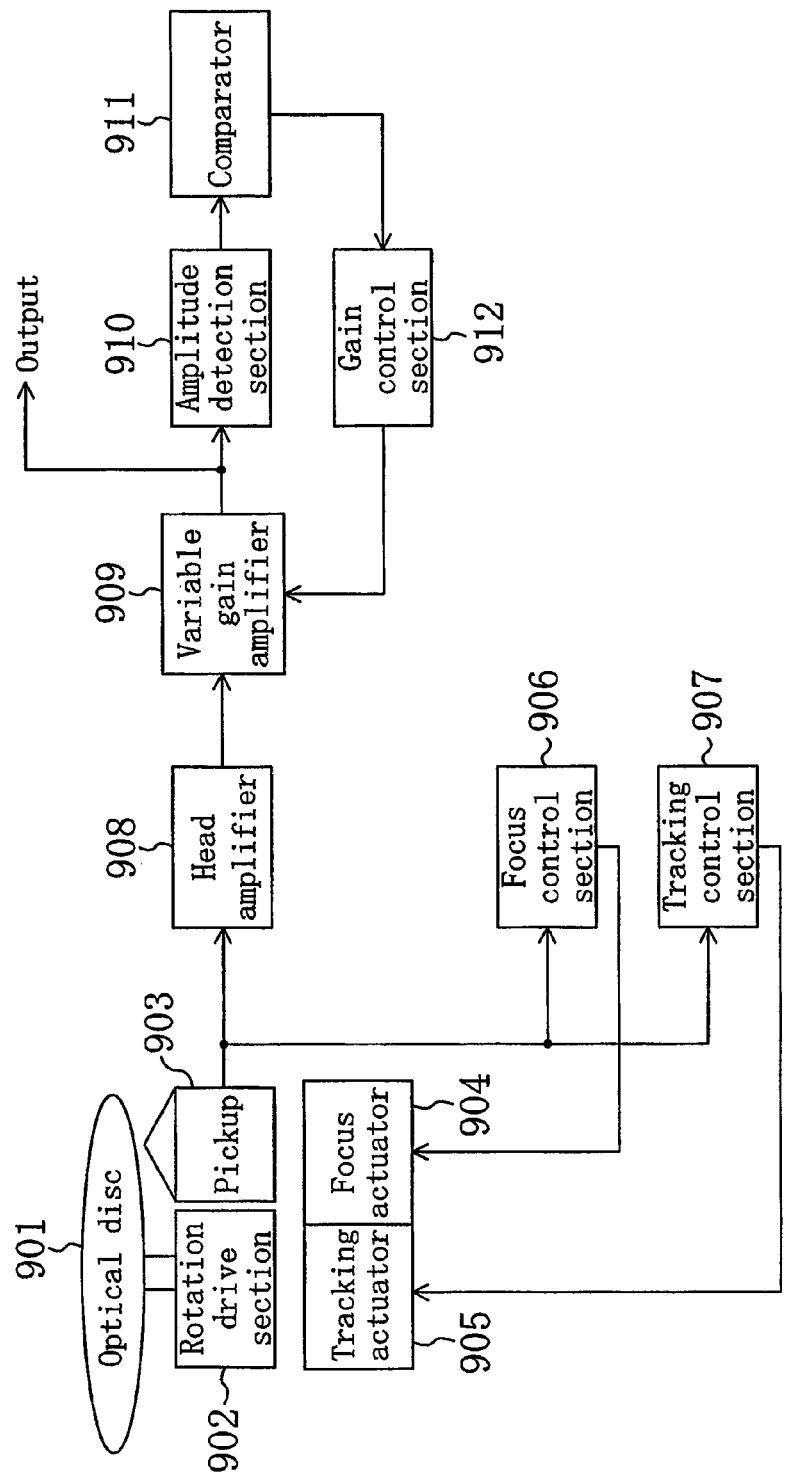
FIG. 10 is a block diagram of a conventional signal reproducing device.
Figure 11:
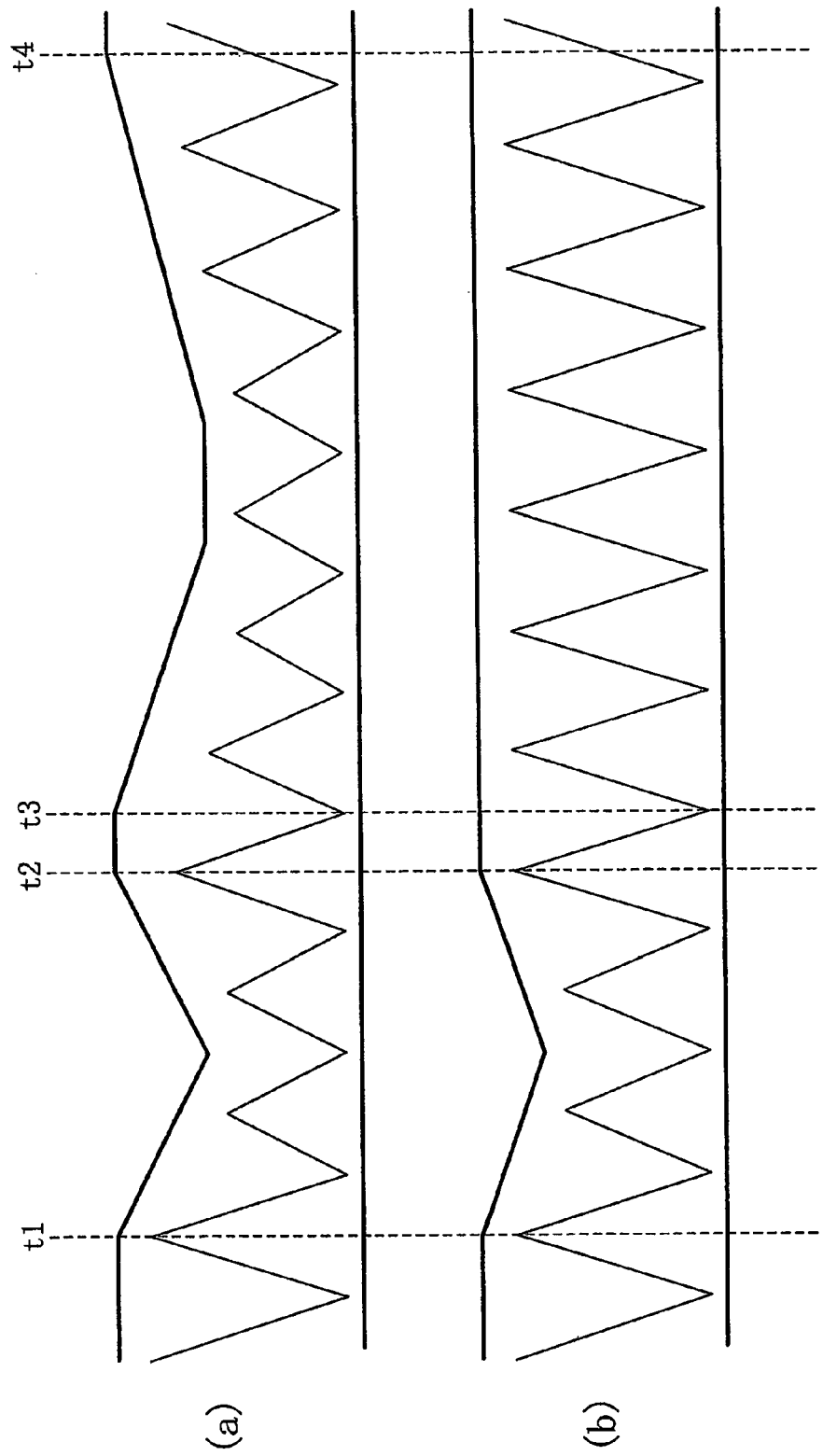
FIG. 11 is a graph showing an example of input/output signals of the variable gain amplifier 909 in the conventional signal reproducing device.

FIG. 9 is a graph showing an example of an input signal (FIG. 9(a)) and an output signal (FIG. 9(b)) of the variable gain amplifier 109 observed when the amplitude of the reproduction signal (output signal of the variable gain amplifier 109) detected by the amplitude detection section 110 varies due to a comparatively small flaw on the optical disc 101, for example, to the extent falling within the range between the reference levels v1 to v2. In this figure, the x-axis represents the time and the y-axis represents the voltage.

As shown in FIG. 9, as long as the reproduction signal amplitude is roughly constant falling within the dead zone between v1 and v2, the gain control section 312 does not change the gain in the variable gain amplifier 109. This suppresses an unintentional variation in reproduction signal amplitude and thus provides a reproduction signal having a stable waveform.

Meanwhile, the gain change amount control section 313 detects repetition of gain-up and gain-down as described in Embodiment 1, and if the number of times of repetition is large, instructs at least either the first comparator 311 or the second comparator 315 to change the reference level v1 or v2 to widen the dead zone. If the number of times of repetition is small, the dead zone is narrowed.

In other words, by widening the dead zone in the gain control section 312 based on the inversion of the signal amplitude large-small comparison results, the stability of AGC in the steady state is secured and thus unintentional jitter can be suppressed, on the one hand. On the other hand, such a situation that the dead zone is so wide that AGC fails to respond is prevented.

Also, if an out-of-focus state or the like is detected by the focus control section or the like as described in Embodiment 2 when the dead zone has been widened, the gain change amount control section 313 turns the width of the dead zone back to its initial state. This prevents the response speed of AGC from being low at the time of recovery from the out-of-focus state or the like, and thus the output of the variable gain amplifier 109 is promptly adjusted to the normal amplitude.

Like the control of the gain change amount described above in Embodiment 1, only narrowing or widening the dead zone may be executed.

In the case of executing only widening the dead zone, there is a possibility that the dead zone is so wide that AGC may fail to respond as described above. In this case, an upper limit of the dead zone may be provided in the gain change amount control section 113, to achieve further stable AGC.

The components and modifications described in the above embodiments may be combined in various ways within the logically allowable range. To state specifically, in place of controlling the gain change amount in Embodiment 1, for example, the width of the dead zone may be controlled as in Embodiment 3. Otherwise, in Embodiments 1 and 2, the width of the dead zone may be controlled in addition to the control of the gain change amount.

In the above examples, the optical disc apparatus using an optical disc as the recording medium was exemplified. It goes without saying that substantially the same effect can also be obtained for disc apparatuses using a magneto-optical disc, a magnetic disc and the like.

Although the optical disc apparatus for reproducing information recorded on an optical disc was exemplified, the present invention is not limited to this but is also applicable to automatic gain control circuits provided with various types of variable gain amplifiers.

INDUSTRIAL APPLICABILITY

The signal reproducing device of the present invention has an effect that it is easily possible to secure the stability in the steady state while enhancing the response of automatic gain control. Such a signal reproducing device is applied to disc systems such as optical disc apparatuses, for example, and is useful as a signal reproducing device for amplifying a reproduction signal reproduced from a recording medium with a variable gain amplifier to reproduce a signal of a predetermined amplitude and as an automatic gain control circuit used for such a signal reproducing device and the like.

The invention claimed is:

1. An automatic gain control circuit for amplifying an input signal, comprising:
    a variable gain amplifier for amplifying an input signal with a variable gain;
    an amplitude detection circuit for detecting the amplitude of the input signal;
    a gain control section for controlling the gain according to the amplitude of the input signal; and
    a gain change amount control circuit for controlling a change amount of the gain controlled, according to frequency of increase/decrease of the gain caused by the control.

2. The automatic gain control circuit of claim 1, wherein the gain change amount control circuit performs at least either control of reducing the gain change amount when the frequency of increase/decrease of the gain is larger than a predetermined value or control of increasing the gain change amount when the frequency of increase/decrease of the gain is smaller than a predetermined value.

3. The automatic gain control circuit of claim 2, wherein the gain change amount control circuit performs either control of reducing the gain change amount within a predetermined lower limit when the frequency of increase/decrease of the gain is larger than a predetermined value or control of increasing the gain change amount within a predetermined upper limit when the frequency of increase/decrease of the gain is smaller than a predetermined value.

4. The automatic gain control circuit of claim 1, wherein the gain change amount control circuit determines the frequency of increase/decrease of the gain based on the amplitude of the input signal.

5. A signal reproducing device for amplifying a reproduction signal reproduced from a recording medium, comprising the automatic gain control circuit of claim 1 for amplifying the reproduction signal.

6. The signal reproducing device of claim 5, further comprising an error detection circuit for detecting at least one error among a focus error, a tracking error and a defect of the reproduction signal,
    wherein the gain change amount control circuit reduces the change amount of the gain when the frequency of increase/decrease of the gain is larger than a predetermined value, and if any of the errors is detected, turns the gain change amount back to a predetermined initial value.

7. An automatic gain control circuit for amplifying an input signal, comprising:
    a variable gain amplifier for amplifying an input signal with a variable gain;
    an amplitude detection circuit for detecting the amplitude of the input signal;
    a gain control section for controlling the gain according to the amplitude of the input signal; and
    a dead zone control circuit for controlling the width of an amplitude detection dead zone in the amplitude detection circuit according to frequency of increase/decrease of the gain caused by the control.

8. The automatic gain control circuit of claim 7, wherein the dead zone control circuit performs at least control of widening the dead zone when the frequency of increase/decrease of the gain is larger than a predetermined value or control of narrowing the dead zone when the frequency of increase/decrease of the gain is smaller than a predetermined value.

9. The automatic gain control circuit of claim 8, wherein the dead zone control circuit performs at least control of widening the dead zone within a predetermined upper limit when the frequency of increase/decrease of the gain is larger than a predetermined value or control of narrowing the dead zone within a predetermined lower limit when the frequency of increase/decrease of the gain is smaller than a predetermined value.

10. The automatic gain control circuit of claim 7, wherein the dead zone control circuit determines the frequency of increase/decrease of the gain based on the amplitude of the input signal.

11. A signal reproducing device for amplifying a reproduction signal reproduced from a recording medium, comprising the automatic gain control circuit of claim 7 for amplifying the reproduction signal.

12. The signal reproducing device of claim 11, further comprising an error detection circuit for detecting at least one error among a focus error, a tracking error and a defect of the reproduction signal, wherein the dead zone control circuit widens the dead zone when the frequency of increase/decrease of the gain is larger than a predetermined value, and if any of the errors is detected, turns the width of the dead zone back to a predetermined initial value.

* * * * *